United States Patent
Yang et al.

(10) Patent No.: US 11,211,628 B2
(45) Date of Patent: Dec. 28, 2021

(54) BISMUTH CALCIUM FERRITES FOR ELECTROLYTE HAVING HIGH OXYGEN IONIC MOBILITY

(71) Applicant: Korea Advanced Institute of Science and Technology, Daejeon (KR)

(72) Inventors: Chan-Ho Yang, Daejeon (KR); Ji Soo Lim, Daejeon (KR)

(73) Assignee: Korea Advanced Institute of Science and Technology, Daejeon (KR)

(*) Notice: Subject to any disclaimer, the term of this patent is extended or adjusted under 35 U.S.C. 154(b) by 230 days.

(21) Appl. No.: 16/566,028

(22) Filed: Sep. 10, 2019

(65) Prior Publication Data

US 2020/0203749 A1    Jun. 25, 2020

(30) Foreign Application Priority Data

Dec. 19, 2018 (KR) .................. 10-2018-0165314
Jul. 26, 2019 (KR) .................. 10-2019-0091037

(51) Int. Cl.
*H01M 8/1246* (2016.01)
*C01G 49/00* (2006.01)
*H01L 45/00* (2006.01)

(52) U.S. Cl.
CPC ........ *H01M 8/1266* (2013.01); *C01G 49/009* (2013.01); *H01L 45/1253* (2013.01); *H01M 2300/0068* (2013.01)

(58) Field of Classification Search
CPC ............. H01M 8/1016; H01M 8/1246; H01M 8/1266; H01M 2300/0068; H01M 2300/0074; H01L 45/08; H01L 45/1226; H01L 45/1253; H01L 45/147; C01G 49/009; G02F 1/525; Y02E 60/50; Y02P 70/50

See application file for complete search history.

(56) References Cited

PUBLICATIONS

Seidel et al., "Prominent electrochromism through vacancy-order melting in a complex oxide," Nat. Commun. 3:799 (2012) (6 pages).*
Afzal et al., "Oxygen electrode reactions of doped BiFeO3 materials for low and elevated temperature fuel cell applications," RSC Adv. 7:47643-47653 (2017).*
Yang et al., "Electric modulation of conduction in multiferroic Ca-doped BiFeO3 films," Nat. Mater. 8(6):485-493 (2009).*
Greicius et al., "Conductivity investigations of pure and Ba, Ca, Sr doped BiFeO3," 18th IEEE International Symposium on the Appliation of Ferroelectrics, Aug. 23-27, Xian, China (2009) (3 pages).*
Greicius et al., "Conductivity investigations of pure and Ba, Ca, Sr doped BiFeO$_3$," 18th IEEE International Symposium on the Applications of Ferroelectrics, August 23-27, Xian, China (2009) (3 pages).
Lim et al., "Ultrafast collective oxygen-vacancy flow in Ca-doped BiFeO$_3$," NPG Asia Materials 10:943-955 (2018).

(Continued)

*Primary Examiner* — Brittany L Raymond
(74) *Attorney, Agent, or Firm* — Clark & Elbing LLP; Susan M. Michaud

(57) ABSTRACT

Disclosed herein are electrolyte bismuth calcium ferrites having high oxygen vacancy ion mobility. There can be provided an oxygen vacancy electrolyte material including bismuth calcium ferrites ($Bi_{1-x}Ca_xFeO_{3-\delta}$).

9 Claims, 15 Drawing Sheets

(56) References Cited

PUBLICATIONS

Office Action dated Jun. 29, 2020 for Korean Patent Application No. 10-2019-0091037, "Bismuth Calcium Ferrites Used as an Electrolyte with a High Ionic Mobility," filed Jul. 26, 2019 (6 pages).
Extended European Search Report, dated Feb. 12, 2020, for European Patent Application No. 19197916.0, Korea Advanced Institute of Science and Technology (7 pages).

* cited by examiner

BISMUTH CALCIUM FERRITES FOR ELECTROLYTE HAVING HIGH OXYGEN IONIC MOBILITY

CROSS REFERENCE TO RELATED APPLICATIONS

This application is based on and claims priority under 35 U.S.C. 119 to Korean Patent Application No. 10-2018-0165314, filed on 2018 Dec. 19, and Korean Patent Application No. 10-2019-0091037, filed on 2019 Jul. 26, in the Korean Intellectual Property Office, the disclosures of each of which are incorporated herein by reference in their entireties.

BACKGROUND OF THE INVENTION

1. Technical Field

The following description relates to bismuth calcium ferrites for an electrolyte having high oxygen ion mobility.

2. Description of the Related Art

Today, an oxygen vacancy electrolyte is used for a fuel cell or electrochromic device.

It is expected that a global fuel cell market volume will reach about 3.6 billion dollars in 2015 and about 25.5 billion dollars in 2024 (Global Market Insights, 2016). A current solid oxide fuel cell is the latest technology having efficiency of 50~60% and requires an innovative and new material in materials for an electrolyte.

Today, the electrochromic technology is used in an electrochromic mirror, an electrochromic smart window and display, and electronic shelf labeling. An electrochromic mirror market, that is, the largest market in the current electrochromic technology, shows annual average growth of 20.4% from 1.98 billion dollars in 2014, and will be a volume of 4.17 billion dollars in 2018.

SUMMARY OF THE INVENTION

Provided is bismuth calcium ferrites, having a high oxygen vacancy diffusivity and oxygen vacancy ion conductivity in a relatively low temperature range of 250° C. to 400° C., as an oxygen vacancy electrolyte material.

There is provided an oxygen vacancy electrolyte material including bismuth calcium ferrites ($Bi_{1-x}Ca_xFeO_{3-\delta}$).

According to an aspect, an oxygen vacancy diffusivity of the oxygen vacancy electrolyte material may be included in a range of $10^{-10}$ to $10^{-6}$ cm$^2$/sec at a temperature of 250° C. to 400° C.

According to another aspect, an oxygen vacancy ion conductivity of the oxygen vacancy electrolyte material may be included in a range of $10^{-2}$ to $10^{-5}$ S/cm based on a ratio of calcium doped into the bismuth calcium ferrites.

According to yet another aspect, in the oxygen vacancy electrolyte material, activation energy of oxygen vacancies may be included in a range of 0.9 to 0.4 eV based on a ratio of calcium doped into the bismuth calcium ferrites.

According to yet another aspect, in the oxygen vacancy electrolyte material, power consumption of a device using the oxygen vacancy electrolyte material may be adjustable by controlling the activation energy of the oxygen vacancies through control of the ratio of calcium.

According to yet another aspect, a ratio of calcium doped into the bismuth calcium ferrites may be included in a range of 0.1 to 0.8.

According to yet another aspect, in the oxygen vacancy electrolyte material, a color may be changed based on moving oxygen vacancies using an electric field.

There is provided a fuel cell including the oxygen vacancy electrolyte material.

There is provided an electrochromic device including the oxygen vacancy electrolyte material.

There is provided a resistance switching memory including the oxygen vacancy electrolyte material.

DETAILED DESCRIPTION

Figure 1:
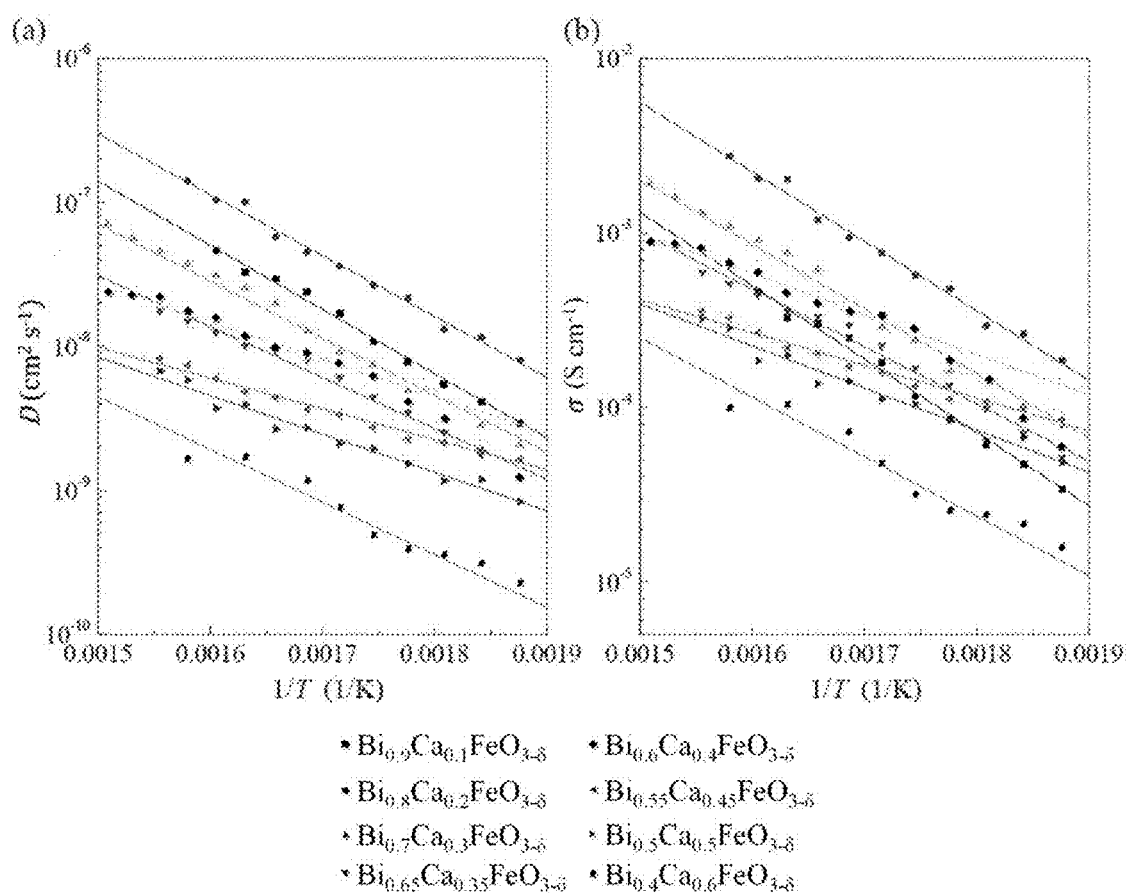
FIG. 1 is a diagram showing examples of (a) diffusivity and (b) ion conductivity of oxygen vacancies of bismuth ferrites into which calcium having various ratios have been doped according to embodiments of the present invention.

Hereinafter, embodiments are described in detail with reference to the accompanying drawings.

Embodiments of the present invention relate to solid electrolyte bismuth calcium ferrites having a high oxygen vacancy ion mobility, and may provide a material in which a concentration of spontaneously generated oxygen vacancies is very higher than that of other materials and is adjusted based on a calcium concentration and which can maintain a stable structure even in the oxygen vacancies having a high concentration. In the case of bismuth calcium ferrites ($Bi_{1-x}Ca_xFeO_{3-\delta}$, calcium ion concentration x=0.1 to 0.8), in all corresponding concentrations, an oxygen vacancy diffusivity is $10^{-10}$ to $10^{-6}$ cm$^2$/sec between 200° C. to 400° C., which is 100 times or more higher than that of the existing prospect solid electrolyte oxides, and an oxygen vacancy ion conductivity is very high, that is, about $10^{-2}$~$10^{-5}$ S/cm.

The existing fuel cell oxides operate at a temperature of 600° C. or higher. In contrast, the proposed material has similar ion conductivity even at a low temperature of 400° C. or low. A low operating temperature may enable the choice of various connection materials (e.g., a positive pole, a negative pole and a packaging material). Furthermore, the proposed elements (i.e., Bi, Ca, Fe, and O) are advantageous in that they are eco-environmental and cheap and are also suitable for a large scale. Furthermore, the materials have great practicality because they have high stability.

The valence state of $Fe^{3+}$ in bismuth calcium ferrites $BiFeO_3$ ($Bi_{1-x}Ca_xFeO_{3-\delta}$; hereinafter referred to as "BCFO") has high stability. Accordingly, the BCFO may be used to explore a collective motion of oxygen vacancies because it spontaneously contains oxygen vacancies in proportion to a calcium substitution ratio. $BiFeO_3$, that is, the parent material, is a representative multiferroic material, which concurrently demonstrates ferroelectric and anti-ferromagnetic properties at room temperature. $BiFeO_3$ belongs to a charge-transfer type insulator due to a large difference of electronegativity between oxygen ions and Fe ions, and shows a wide optical bandgap of 2.7 eV. The lattice constant of the BCFO is reduced as 2-valance Ca ions are substituted with Bi ions because the Ca ion has a smaller radius than the Bi ion. Furthermore, hole carriers generated by Ca ions are offset by electron carriers generated by oxygen vacancies because a concentration ($N_{vac}=x/2$) of the oxygen vacancies is in proportion to a concentration ($N_{ca}=x$) of Ca ions, and still maintain a high insulating state. In an electronic band structure observed via x-ray photoelectron spectroscopy (XPS) and x-ray absorption spectroscopy (XAS), an optical band gap is still comparable to that of $BiFeO_3$ and the Fermi level lies at the top of the valence band. From these results, it can be seen that oxygen vacancies are dominantly doubly ionized defects of which states have the lowest defect formation energy.

Based on the results, the oxygen vacancies are mobile under the application of an external bias at an elevated temperature. The oxygen vacancies are spatially redistributed to form a conducting region, including poor oxygen vacancies and free hole carriers. The conducting region has $10^5$ times greater magnitude compared to its initial state at room temperature. The oxygen vacancies may be finally accumulated near a negatively biased electrode to create an n-type region, which exhibits characteristics similar to those of a p-n diode in electronic conduction. It could be seen that almost all oxygen vacancies are migrated through stoichiometry analysis via oxygen is x-ray photoelectron spectroscopy. A region having a sparse oxygen vacancy concentration may be transformed into a dark-colored region, which is induced by the absorption of light attributable to free hole carriers also called as an electrochromic effect.

Hereinafter, the correlation between an oxygen vacancy concentration and a motion of oxygen vacancies is described by observing a collective motion of the oxygen vacancies in BCFO thin films of different Ca substitution ratios. The oxygen vacancies show a distinct phase boundary between a dark color and a bright color, and are collectively migrated. Accordingly, they can be optically visualized by tracking a color change over time. The propagations of oxygen vacancies within various temperature ranges may provide thermodynamic variables, such as diffusivity, mobility and an activation barrier. It can be confirmed that that BCFO films of all Ca substitution ratios have high oxygen vacancy diffusivities in the range of $10^{-6}$-$10^{-9}$ cm$^2$s$^{-1}$ even at a low temperature regime (200-400° C.). The present invention can provide a mechanism of the collective behaviors of high-mobility oxygen vacancies by providing a relationship between oxygen vacancy mobility and concentration.

FIG. 1 is a diagram showing examples of (a) diffusivity and (b) ion conductivity of oxygen vacancies of bismuth ferrites into which calcium having various ratios have been doped according to embodiments of the present invention. In FIG. 1, each solid line shows a linear proportion of log diffusion coefficients for a reciprocal (1/T) of a temperature. From FIG. 1, it may be seen that in the plot of the reciprocal (1/T) of ion diffusion coefficients (D) versus temperatures, the linear relationship provides an activation energy barrier for each Ca substitution ratio. As the Ca substitution ratio increases, the activation energy barrier suddenly drops to 0.43 eV in the BCFO film where x=0.45. This is significantly lower than that of the existing oxides ion conductor. As described above, the BCFO can create one oxygen vacancy every two calcium ions, and may have a stable structure although they contain a large amount of oxygen vacancies. Calcium-doped bismuth ferrites exhibit a dark opaque color if a concentration of oxygen vacancies is rarely present, and exhibit a yellow color, that is, the color of a raw material if a concentration of oxygen vacancies is high. If an external electric field is applied to the BCFO, a large amount of oxygen vacancies are migrated in a negative pole direction at the same time. While the electric field is applied, the oxygen vacancies are migrated from the positive pole side, resulting in a change into a very dark color. In the region where oxygen vacancies are rarely present, electrical conductivity at room temperature rises $10^5$ times or more compared to the region where oxygen vacancies are present because hole electrons exit from calcium ions.

Figure 2:
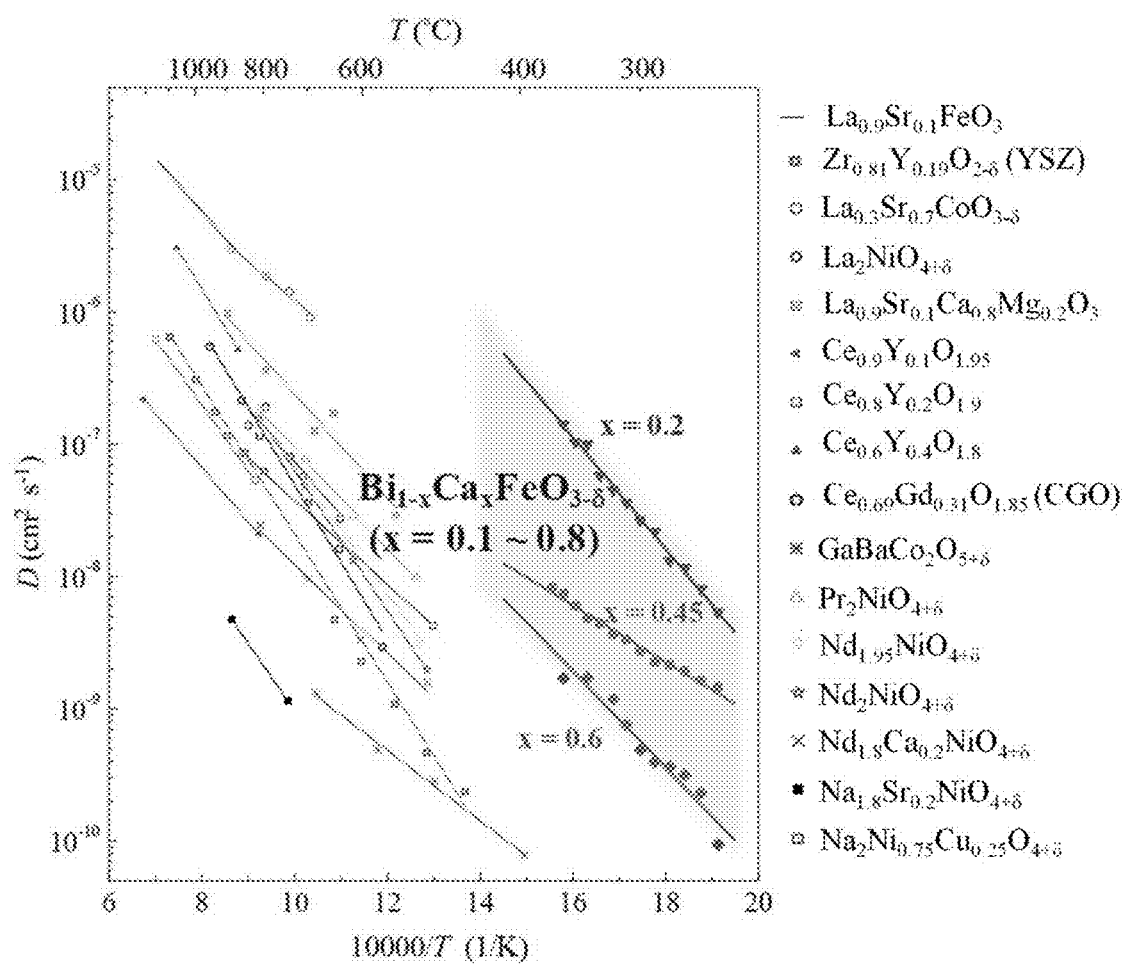
FIG. 2 is a diagram showing an example of oxygen vacancy diffusivity according to temperatures of various oxides according to an embodiment of the present invention.

FIG. 2 is a diagram showing an example of oxygen vacancy diffusivity according to temperatures of various oxides according to an embodiment of the present invention. Bismuth oxides into which calcium having various ratios has been doped may have oxygen vacancy diffusivity of $10^{-10}$ to $10^{-6}$ cm$^2$/sec between 250° C. to 400° C. Common metal oxides have oxygen vacancy diffusivity comparable to that of the BCFO according to embodiments of the present invention only at a high temperature of 600° C. or more. This may mean that as the diffusivity becomes higher, oxygen vacancies can migrate at a very high speed and a state change according to a concentration of the oxygen vacancies can be implemented at a very high speed. Bismuth calcium ferrites according to embodiments of the present invention have a high concentration of oxygen vacancies and a high diffusivity property and have a very high oxygen vacancy ion conductivity of $10^{-2}$ to $10^{-5}$ S/cm.

Figure 3:
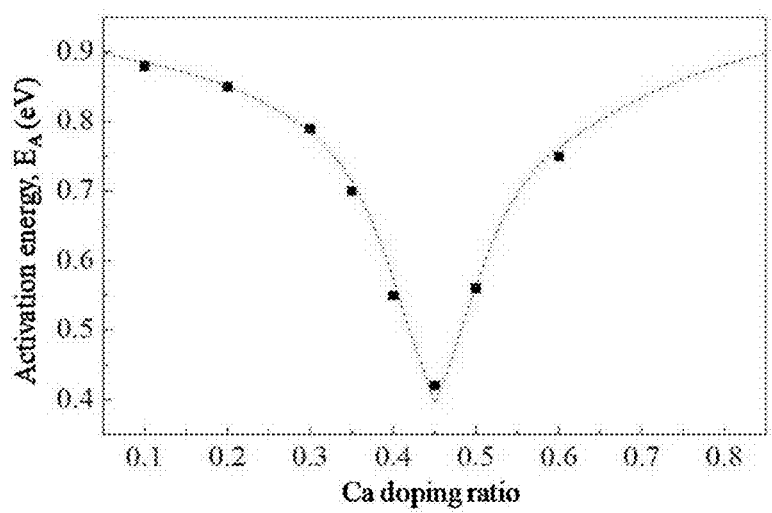
FIG. 3 is a diagram showing an example of activation energy of oxygen vacancies according to a calcium doping ratio according to an embodiment of the present invention.

FIG. 3 is a diagram showing an example of activation energy of oxygen vacancies according to a calcium doping ratio according to an embodiment of the present invention. Activation energy of oxygen vacancies may have a value between 0.9 and 0.4 eV depending on a concentration of calcium ions. In the case of bismuth ferrites into which calcium ions of 45% having the smallest activation energy of 0.43 eV have been doped, oxygen vacancies can be easily migrated although a low electric field is applied. In this case, FIG. 3 shows that in the BCFO film, if Ca exceeds x=0.45, an activation energy barrier increases and a symmetrical shape appears around x=0.45. Activation energy can be adjusted by selecting a calcium doping ratio. This may mean that the migration of oxygen vacancies can reduce power consumption of an important device. Furthermore, there can be provided a material in which oxygen vacancies can migrate in a low power environment, while having optimal lifespan, by selecting calcium ion doping suitable for a purpose.

Figure 4:
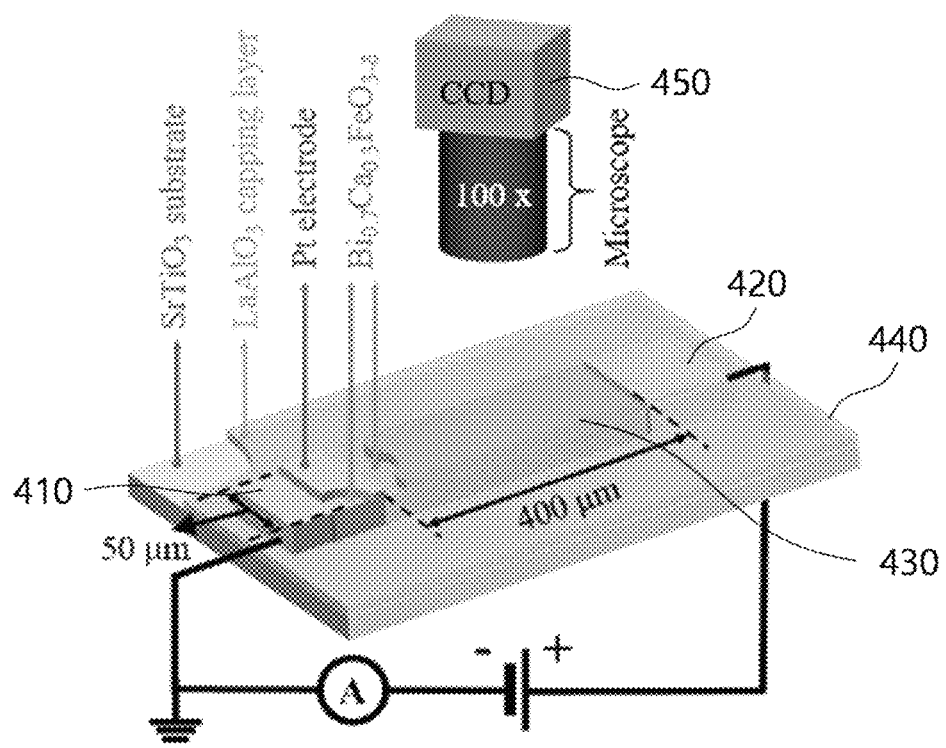
FIG. 4 is a diagram showing an example of a BCFO channel between electrodes according to an embodiment of the present invention.

FIG. 4 is a diagram showing an example of a BCFO channel between electrodes according to an embodiment of the present invention. FIG. 4 shows bismuth calcium ferrites ($Bi_{1-x}Ca_xFeO_{3-\delta}$, BCFO) channel 430 formed between a pair of electrodes 410 and 420 on the same plane having an interval of 400 μm. For example, the BCFO channel 430 may be formed to have a length of 400 μm and a width of 50 μm, and may be formed for each of all Ca substitution ratios (i.e., x=0.1~0.6). The migration of oxygen vacancies may be visualized and tracked through the BCFO channel 430. The embodiment of FIG. 4 shows an example in which $Bi_{0.7}Ca_{0.3}FeO_{3-\delta}$ is used. In this case, while an electric bias of +25V is applied, a real-time current and optical microscope video through the BCFO channel 430 may be recorded at the same time. The optical microscope video may be obtained through a CCD camera 450. The CCD camera 450 may be used to visualize and track the migration of oxygen vacancies in the BCFO channel having a length of 400 μm. An optically transparent epitaxial $LaAlO_3$ film 440 (e.g., having a thickness of 10 nm) may be deposited on top of the BCFO channel. The $LaAlO_3$ film 440 has relatively high oxygen vacancy formation energy of 7.3 eV compared to other oxide materials, and thus oxygen vacancies are rarely created. Based on such a fact, the $LaAlO_3$ film functions as a capping layer for preventing the BCFO film from reacting to surrounding oxygen. In the BCFO channel 430, the amount of oxygen vacancies that are separated from external oxygen and participate in the migration process can be reserved through such a capping layer. In an embodiment, a film for the BCFO channel 430 may be grown in a step-flow mode, and may show an atomically flat expression having a step-terrace structure. If an external DC voltage (e.g., 25V) is applied at an elevated temperature, oxygen vacancies of the BCFO channel 430 migrate toward the negatively biased electrode. During the electroforming process, a change in electricity conductivity and a change into an electrically formed state may be checked based on simultaneously measured currents. During the electroforming process, a region from which oxygen vacancies have exited may be transformed into a dark phase. The deployment of the dark phase may be photographed as 6 frames per second, for example, using the CCD camera 440. The dark phase is expanded, while showing a distinct color boundary indicating the interface between a portion where oxygen is insufficient and a portion where oxygen is sufficient. Accordingly, the trace of color lines may provide the trajectories of collective oxygen vacancies. In this case, a color diagram may be generated by extracting the center line of the BCFO channel from each still image.

Figure 5:
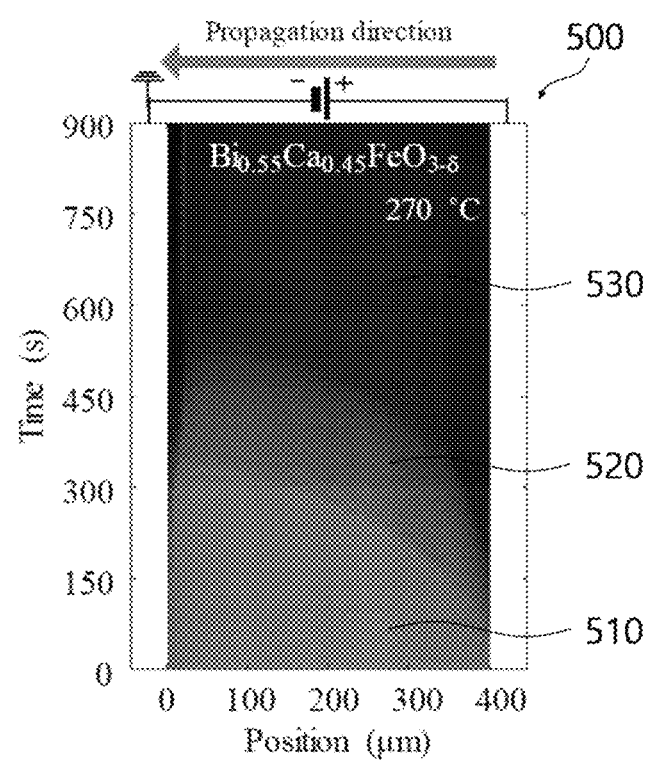
FIG. 5 is a diagram showing an example of a diagram of optical contrast visualized in real time according to the center line of a channel in an electroforming process according to an embodiment of the present invention.

FIG. 5 is a diagram showing an example of a diagram of optical contrast visualized in real time according to the center line of a channel in an electroforming process according to an embodiment of the present invention. During the electroforming process, a first region 510 as an as-grown state may be transformed into a second region 520 as dark-yellow region, that is, an intermediated state. As a result, the second region 520 as dark-yellow region may be fully transformed into a third region 530 as dark-colored region, that is, an electrically formed state. The color diagram 500 of FIG. 5 clearly shows all the three states in black and white.

Figure 6:
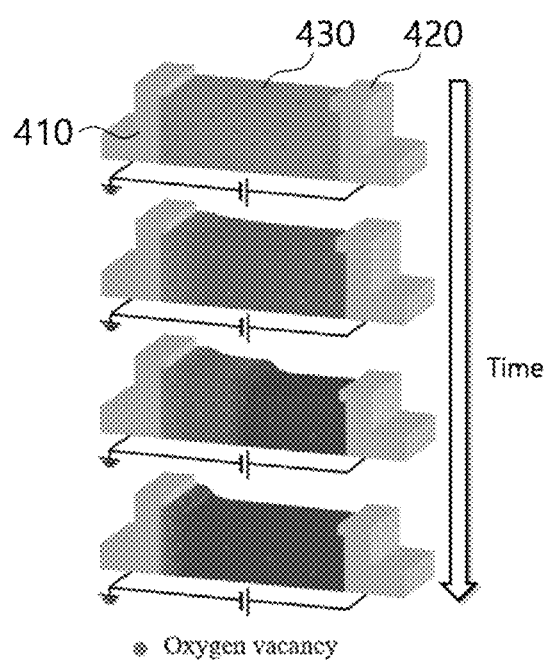
FIG. 6 is a diagram showing an example of oxygen vacancies moving toward a negatively biased electrode according to an embodiment of the present invention.

FIG. 6 is a diagram showing an example of oxygen vacancies moving toward the negatively biased electrode according to an embodiment of the present invention. Oxygen vacancies cannot be continuously supplied from the positive pole side under a DC electric field because the size of the channel is limited. As a result, a stoichiometric phase that has been fully oxidized due to the removal of oxygen vacancies may form a nucleus around the electrode. FIG. 6 shows a process for the BCFO channel 430 to gradually (from right to left) change into a dark color over a flow of time as oxygen vacancies are propagated from the positively biased electrode 420 to the negatively biased electrode 410.

In this case, the propagation of color lines between the dark phase and the dark-yellow phase may be calculated like Equation 1.

$$Z(t)=L-\sqrt{L^2-2V(t-t_0)/nq\rho(T)} \qquad [\text{Equation 1}]$$

In Equation 1, L may mean the length (i.e., 400 μm) of the BCFO channel 430, Z(t) may mean the length of a conducting region, n may mean a concentration of oxygen vacancies, q may mean ion charges, and t may mean an elapsed time. Two terms $\rho(T)$ and $t_0$ may mean ion resistance and a time offset determined based on the fitting curve of experiment data.

Figure 7:
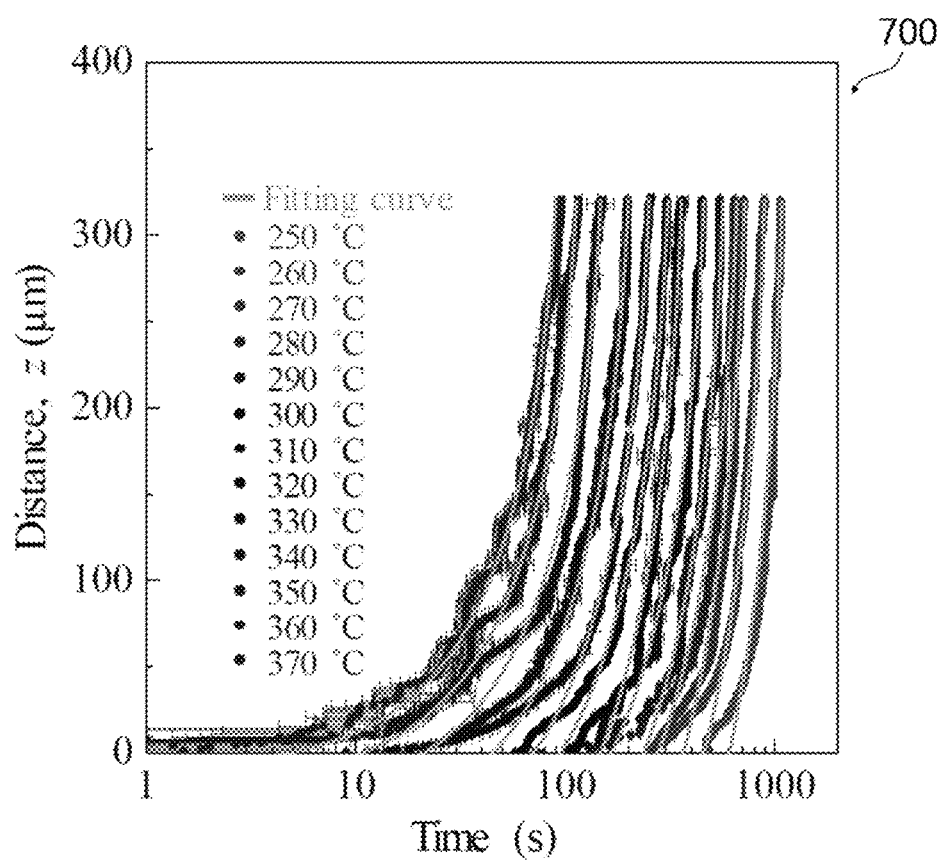
FIG. 7 is a graph showing the trajectories of oxygen vacancies as a function of an elapsed time according to an embodiment of the present invention.

FIG. 7 is a graph showing the trajectories of oxygen vacancies as a function of an elapsed time according to an embodiment of the present invention. The graph 700 of FIG. 7 shows the trajectories of oxygen vacancies, obtained from the boundary between the intermediate dark-yellow phase and the dark phase, according to elapsed time. An error range of the trajectories of oxygen vacancies over time may be evaluated as a full-width-half maximum (FWHM). A fitting curve well shows that a simplified model well describes experiment data. Also, the graph 700 of FIG. 7 shows that the distance increases relatively faster at higher temperatures.

From the graph 700 of FIG. 7, it can be seen that in the $BiFeO_3$ (BCFO45) film in which Ca 45% has been substituted, all the trajectories of oxygen vacancies well fit the propagation equation of Equation 1 at different temperatures.

Figure 8:
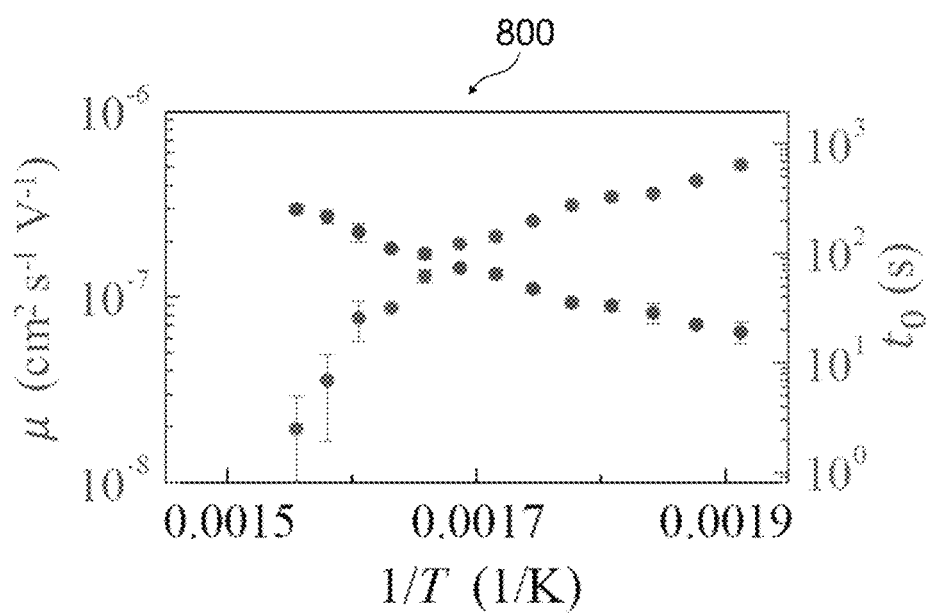
FIG. 8 is a graph showing a relation between temperatures and ion mobility (μ) according to an embodiment of the present invention.
Figure 9:
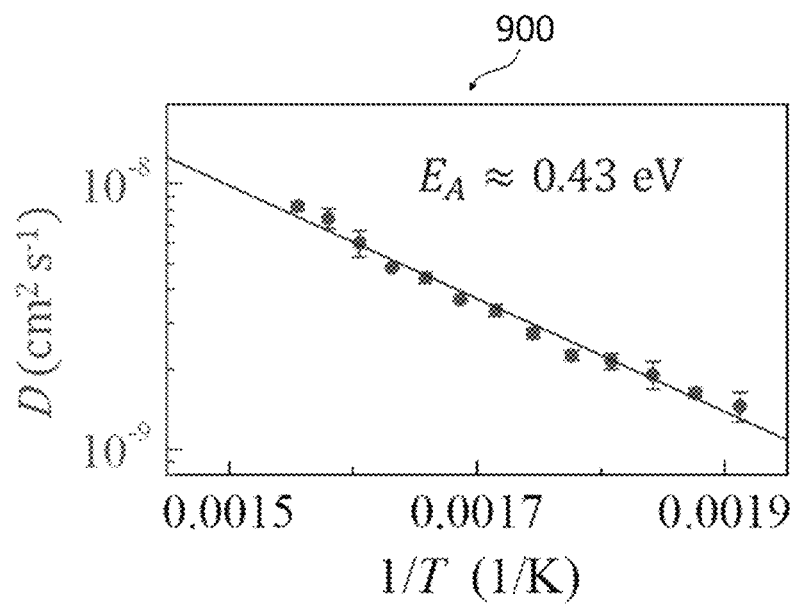
FIG. 9 is a graph showing a relation between temperatures and ion diffusion coefficients according to an embodiment of the present invention.

Ion mobility and a time offset may be evaluated based on the fitting parameters of FIG. 7, and diffusivity may be derived from the mobility. For example, the ion mobility and the time offset may be determined as a function of temperature based on the fitting parameters. FIG. 8 is a graph showing a relation between temperature and ion mobility ($\mu$) according to an embodiment of the present invention. The ion mobility means how ions can move per unit electric field. A high ion mobility means that ions can migrate very rapidly even with a low electric field. FIG. 9 is a graph showing a relation between temperature and an ion diffusion coefficient according to an embodiment of the present invention. Referring to FIGS. 8 and 9, the ion diffusion coefficient D may be calculated from $\mu(T)$ according to a relation equation $D=\mu k_B T/q$. In this case, $k_B$ may be a Boltzmann constant. A linear relation D and algebra of 1/T may indicate activation energy of ~0.43 eV.

Figure 10:
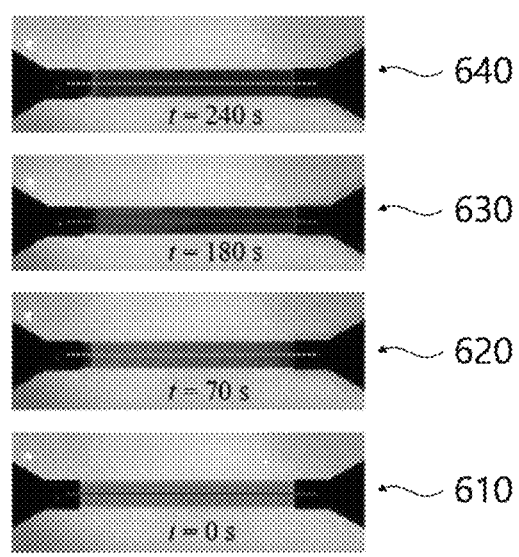
FIG. 10 is a graph showing optical microscope photos illustrating examples of a color change in the BCFO channel over time according to an embodiment of the present invention.

FIG. 10 shows optical microscope photos illustrating examples of a color change in the BCFO channel over time according to an embodiment of the present invention. FIG. 10 shows an optical microscope photo 610 at 0 second, an optical microscope photo 620 after 70 seconds, an optical microscope photo 630 after 180 seconds, and an optical microscope photo 640 after 240 seconds, after an external DC voltage (e.g., 25V) is applied. From the optical microscope photos 610 to 640, it can be seen that the color of the BCFO channel becomes dark as oxygen vacancies are migrated over time.

The migration of oxygen vacancies may be tracked by observing BCFO films having different Ca substitution ratios (x=0.1~0.6) using an optical microscope, and diffusivity may be obtained based on fitting parameters. It could be seen that all trajectories well fit the propagation equation of Equation 1.

Figure 11:
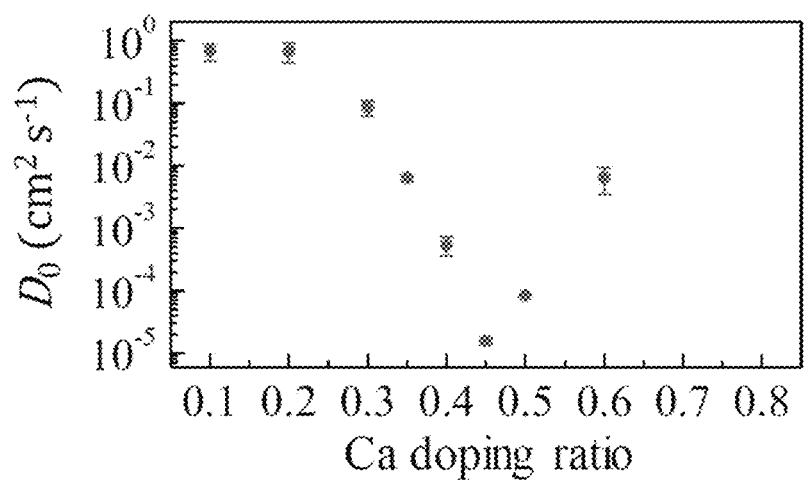
FIG. 11 is a graph showing a relation between a Ca substitution ratio and a reserved factor ($D_0$) of a diffusion coefficient according to an embodiment of the present invention.

FIG. 11 is a graph showing a relation between a Ca substitution ratio and a reserved factor ($D_0$) of a diffusion coefficient according to an embodiment of the present invention. FIG. 11 shows that the reserved factor ($D_0$) of the diffusion coefficient shows behaviors similar to those of the activation energy barrier of FIG. 2.

The activation energy of FIG. 2 and the reserved factor of FIG. 11 may be obtained from an oxygen vacancy diffusion equation, such as Equation 2, in a BCFO film having a calcium doping ratio of 0.1 to 0.6, for example.

$$D = D_0 \exp(-E_A/k_B T) \quad \text{[Equation 2]}$$

Figure 12:
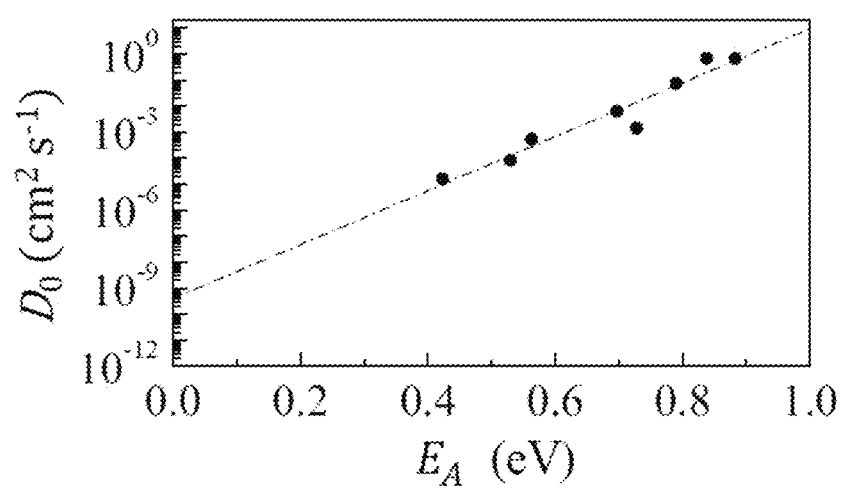
FIG. 12 is a graph showing a relation between activation energy and the reserved factor according to an embodiment of the present invention.

FIG. 12 is a graph showing a relation between the activation energy and the reserved factor according to an embodiment of the present invention. FIG. 12 shows that the reserved factor ($D_0$) is lineally proportional to the activation energy barrier ($E_A$).

Figure 13:
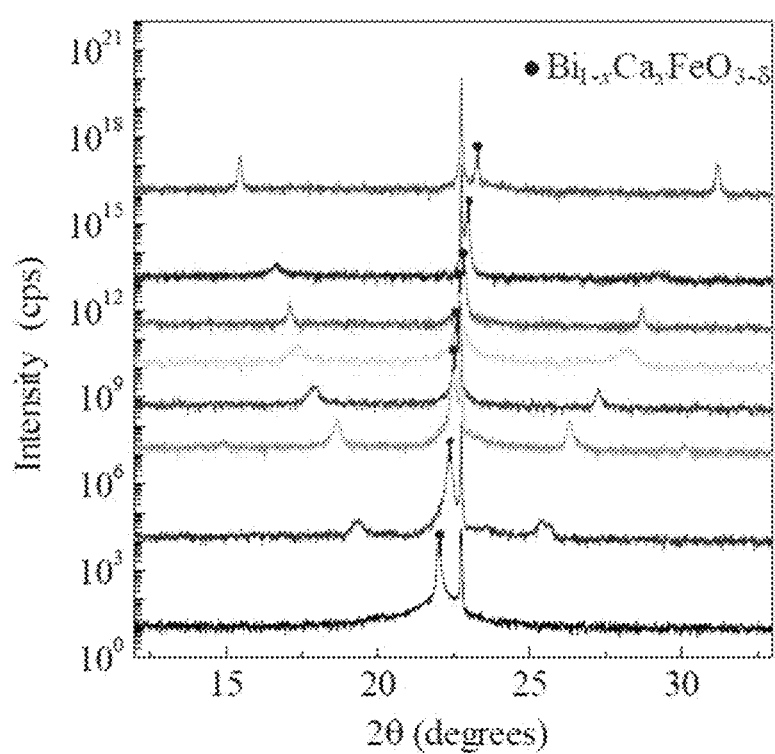
FIG. 13 is a graph showing x-ray diffraction of a BCFO film according to an embodiment of the present invention.
Figure 14:
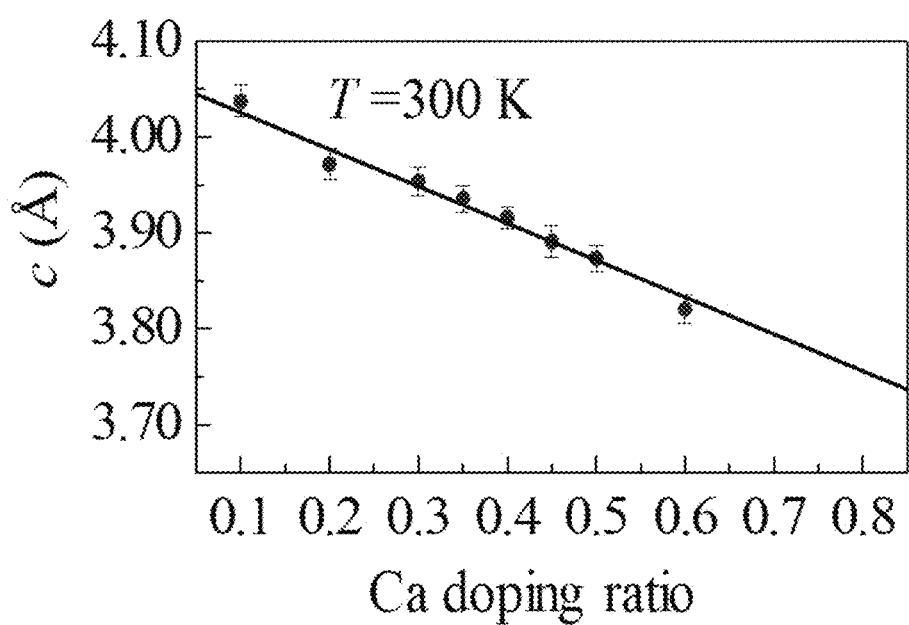
FIG. 14 is a graph showing c-axis lattice parameters of the BCFO film according to an embodiment of the present invention.
Figure 15:
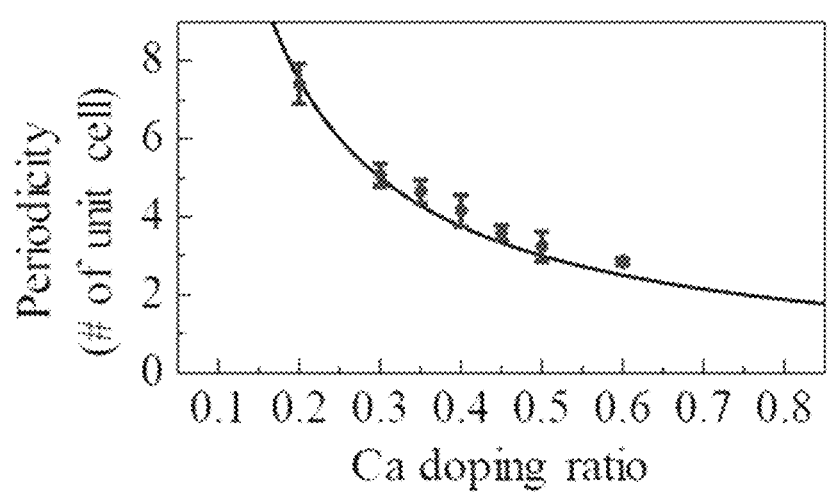
FIG. 15 is a graph showing the cycle of oxygen vacancies occurring in an out-of-plane direction in the BCFO film according to an embodiment of the present invention.

FIG. 13 is a graph showing x-ray diffraction of the BCFO film according to an embodiment of the present invention. A c-axis lattice parameter of the BCFO film, indicated by a blue circle in X-ray diffraction (XRD), may be continuously decreased according to the linear interpolation of a $BiFeO_3$ film and a $CaFeO_{2.5}$ film on an $SrTiO_3$ substrate (refer to FIG. 14). It may be seen that all the films between Ca substitution ratios x=0.2 and 0.6 exhibit superlattice peaks on both sides of a film peak and thus oxygen vacancies are self-assembled and periodically ordered. This is based on an empirical rule (i.e., $N_{period}$=1.5/x) as in a graph of FIG. 15 showing the cycle of oxygen vacancies that occur in an out-of-plane direction in the BCFO film.

In the case of the Ca substitution ratio x=0.1, it has been known that oxygen vacancies are ordered in a 2 to 3-unit cell cycle in a (101) direction that forms an angle of 45° in a substrate surface. Furthermore, a corresponding BCFO film exhibits instability against ferroelectrics because it has a crystal structure at the phase boundary of monoclinic and pseudo-tetragonal. A Ca substitution ratio of x=0.45 at which the BCFO film shows an almost cubic structure may show the boundary of tensile and compressive strains. In a BCFO film having a Ca substitution ratio of x=0.5 or more, as in the graph of FIG. 14, tensile deformation may be assigned to the BCFO film because the c-axis lattice parameter is smaller than the $SrTiO_3$ substrate.

Growth of Epitaxial BCFO Thin Film and Characteristics of Crystal Structure

A pellet including a 10% bismuth excess was fabricated by mixing $Bi_2O_3$ (99.9%), CaO (99.95%) and $Fe_2O_3$ (99.9%) powders (Sigma-Aldrich) according to a Ca doping ratio. The pellet was pressed at 4 MPa for 10 minutes and calcined at 700° C. for 7 hours at an ambient condition. After the calcination, the pellet was ground to be fine powder. The powder was pressurized at 6 MPa to form a 1-inch diameter button-shaped target. Then, the target was sintered at 750° C. for 7.5 hours at an ambient condition. Epitaxial $Bi_{1-x}Ca_xFeO_{3-x/2}$ (BCFO) thin films having a Ca substitution ratio (x=0.1~0.6) were deposited on a $SrTiO_3$(001) substrate (CrysTec GmbH) by pulsed laser deposition using a KrF excimer laser (λ=248 nm). A heater temperature during the film growth was 665° C. in an oxygen environment of 0.05 Torr. Laser fluence and a repetition rate were set as ~1 J/cm$^{-2}$ and 10 Hz. All the films were in-situ cooled down to room temperature at a rate of 10° C./min$^{-1}$ under an oxygen environment of 500 Torr. A C-axis lattice parameter of as-grown BCFO thin films was performed by a four-circle X-ray diffractometer (PANalytical X'Pert PRO MRD) using Cu K$_{\alpha 1}$ radiation.

Fabrication of BCFO Fine Channel Device

Eight channel (440 μm×50 μm) device patterns were printed on each as-grown BCFO thin film having all Ca doping ratios using typical UV-lithography. AZ5214E photoresist (AZ electronic materials) was used as a positive printing material in order to remove a UV-irradiant area. The patterned samples were dry-etched by Ar$^+$ ion milling using a 2.5-cm diameter DC ion beam source. Unexposed areas of the photoresist were slowly etched at a rate of ~1 nm/min$^{-1}$ by applying a 750 V beam voltage and a 5 mA beam current in order to prevent a surface damage. During the etching process, all samples were sustained at room temperature by continuously circulating cooling water in order to prevent thermal decomposition and degradation. After the etching process is completed, an $LaAlO_3$ capping layer of 10 nm in thickness was deposited on the entire surface of the samples using pulsed laser deposition. All the areas of the patterned samples, including channel edges, were protected against an external reaction to oxygen ions in air. The capping layer was grown at a heater temperature of 650° C. in oxygen pressure of 0.01 Torr, a laser fluence of ~1 J/cm$^{-1}$ and a repetition rate of 2 Hz. After the epitaxial growth, all the samples were cooled down at a rate of 10° C./min$^{-1}$ under an oxygen environment of 500 Torr. Eight pairs of electrodes were patterned on both sides of the BCFO channels using conventional UV-lithography. The BCFO channels were scaled to have a horizontal length of 400 μm and a vertical length of 50 μm. The $LaAlO_3$ capping layer was removed from the electrode areas in order to directly bring platinum electrodes into contact with the BCFO surface using Ar$^+$ ion milling. Thereafter, platinum was in-situ deposited through DC magnetron sputtering operating by power of 25 W under argon pressure of 5 mTorr in order to reduce an exposure to external oxygen atoms.

Optical Visualization and Electric Measurement

The patterned BCFO thin films were attached to a custom-made heater mounted on an optical microscope stage (Hi-Max Tech, HNM005). The custom-made heater was constructed by putting an Ni—Cr alloy wire and molding an alumina cement between alumina plates. A K-type thermocouple was installed on a surface of the heater in order to measure the temperature of the BCFO thin films. A 30 W power supplier was used to control the temperature of the heater to a maximum of 400° C. A 10 times (x) long working distance objective lens and a 10× eyepieces were used to magnify the patterned BCFO thin films 100 times and to obtain 34 mm spacing between the BCFO thin films and the lens. A color CCD (Veltek, CVC-5520) camera with resolution 720×480 was mounted on an optical microscope in order to record the electrical forming process of the BCFO thin films at a rate of 6 frames per second. Two gold-coated probe tips were connected to positioners (MS Tech) using the platinum electrodes of the BCFO channel. A voltage source (Tektronix, Keithley 230) and a current meter (Tektronix, Keithley 2000) were used to perform the electroforming process on the BCFO thin films. At this time, an electrical current and a video image were measured by applying an external voltage of 25 V at high temperatures simultaneously.

Evaluation of Oxygen Diffusivity Through Video Analysis

Still images of the electroforming process were extracted from the video material using Adobe Premier Pro CC 2015 software. Each still image included R (red), G (green) and B (blue) information. The BCFO channel area was divided into 9 parts in its vertical direction. The center line of the sample was focused, and had a width of ~5.6 μm. All the lines including 5 pixels were stacked in elapsed time order. The same analysis process was performed at all different temperature ranges. The pre-processing process was performed on different channels of the BCFO thin film at each temperature. Each component of RGB color information was interpolated to a reference value determined based on an average RGB value of the initial sample color and an electrically formed sample color. A reference RGB value was dependent on a Ca doping ratio because the intensity of a dark area was changed by a concentration of hole carriers induced by a Ca concentration. The boundary between the dark areas showed the motion trajectory of oxygen vacancies. The trajectories were extracted by calculating a minimum value of differentiation for a time axis at each position. A value of a time error was derived from a full-width-at-half-maximum (FWHM) of a Gaussian peak at the minimum point in the differentiation. Likewise, position error information was evaluated from the FWHM of the Gaussian peak in differentiation along the position axis. The parameters of the fitting equation for the trajectories were evaluated using Origin 8.5 software.

As described above, the BCFO according to embodiments of the present invention has high oxygen vacancy conductivity and exhibits a color change based on an oxygen vacancy concentration. Accordingly, the BCFO may be used for a solid electrolyte and electrochromic device that require the conduction of oxygen ions. For example, the BCFO may be used for the electrolyte of a solid fuel cell, a resistance switching memory, and an electrochromic device, but is not limited thereto. The BCFO may be widely applied to various applications that require the migration of oxygen vacancies.

An oxide fuel cell is a cell using chemical energy that receives surrounding oxygen as electrical energy. The BCFO may be greatly expected as a new material for a fuel cell electrolyte because it can transfer a large amount of oxygen vacancies at the speed of 100 times or more compared to the existing fuel cell oxides.

Furthermore, an electrochromic device is a device that changes the color of a material using an electric field. The BCFO can move oxygen vacancies at a very fast speed although it uses a low electric field. As the oxygen vacancies move, a transparent yellow color, that is, the original color of the material changes into an opaque dark color. The BCFO may be used for an electrochromic device capable of changing color at a very fast speed, using such a property.

As described above, in accordance with the embodiments of the present invention, there can be provided an oxygen vacancy electrolyte material including the BCFO. The oxygen vacancy electrolyte material including the BCFO may enable the choice of various connection materials (e.g., a positive pole, a negative pole, and a packaging material) because it has high oxygen vacancy diffusivity and oxygen vacancy ion conductivity in a relatively low temperature range of 250° C. to 400° C. The components (i.e., Bi, Ca, Fe, and O) are eco-environmental, cheap and suitable for a large scale use, and have high practicality because they have high stability. Furthermore, activation energy of oxygen vacancies can be adjusted to a range of 0.9 to 0.4 eV by controlling the ratio of calcium. A high mobility of oxygen vacancies can be obtained at a low temperature through control of activation energy of the oxygen vacancies by controlling the ratio of calcium.

Ion conductivity may be represented as $\sigma = \sigma_0 \exp(-E_A/k_B T)$. $E_A$ is activation energy of oxygen vacancies, $k_B$ is a Boltzmann constant, and T is temperature. In general, when the temperature drops, the ion conductivity suddenly drops. However, sufficiently high ion conductivity can be maintained even at a low temperature ($T \leq 400°$ C.) near room temperature if activation energy is small. A high oxygen vacancy current can be generated by a low electric field because an oxygen vacancies current capable of moving in each unit area per second is represented as $J = \sigma E$ (E is an electric field). This is a base capable of reducing power consumption of a device using an oxygen vacancy electrolyte material.

The BCFO having high oxygen vacancy diffusivity and oxygen vacancy ion conductivity in a relatively low temperature range of 250° C. to 400° C. can be provided as an oxygen vacancy electrolyte material.

As described above, although the embodiments have been described in connection with the limited embodiments and the drawings, those skilled in the art may modify and change the embodiments in various ways from the description. For example, proper results may be achieved although the above-described descriptions are performed in order different from that of the described method and/or the above-described elements, such as the system, configuration, device, and circuit, are coupled or combined in a form different from that of the described method or replaced or substituted with other elements or equivalents.

Accordingly, other implementations, other embodiments, and the equivalents of the claims belong to the scope of the claims.

What is claimed is:

1. An oxygen vacancy electrolyte material comprising bismuth calcium ferrites ($Bi_{1-x}Ca_xFeO_{3-\delta}$), wherein x is greater than 0.4 and less than 0.5.

2. The material of claim 1, wherein an oxygen vacancy diffusivity of the bismuth calcium ferrites is included in a range of $10^{-10}$ to $10^{-6}$ cm$^2$/sec at a temperature of 250° C. to 400' C., as determined by optical contrast visualized in real time according to a center line of a channel formed from the material in an electroforming forming process.

3. The material of claim 1, wherein an oxygen vacancy ion conductivity of the bismuth calcium ferrites is included in a range of $10^{-2}$ to $10^{-5}$ S/cm based on a ratio of calcium doped into the bismuth calcium ferrites at a temperature of 250° C. to 400° C., as determined by optical contrast visualized in real time according to a center line of a channel formed from the material in an electroforming forming process.

4. The material of claim 1, wherein activation energy of oxygen vacancies is included in a range of 0.9 to 0.4 eV based on a ratio of calcium doped into the bismuth calcium ferrites at a temperature of 250° C. to 400° C.

5. The material of claim 4, wherein power consumption of a device using the oxygen vacancy electrolyte material is adjustable by controlling the activation energy of the oxygen vacancies through control of the ratio of calcium doped into the bismuth calcium ferrites.

6. The material of claim 1, wherein a color in the bismuth calcium ferrites is changed based on moving oxygen vacancies using an electric field.

7. A fuel cell comprising an oxygen vacancy electrolyte material of claim 1.

8. An electrochromic device comprising an oxygen vacancy electrolyte material of claim 1.

9. A resistance switching memory comprising an oxygen vacancy electrolyte material of claim 1.

* * * * *